United States Patent [19]

Takeuchi et al.

[11] 4,345,241

[45] Aug. 17, 1982

[54] ANALOG-TO-DIGITAL CONVERSION METHOD AND APPARATUS

[75] Inventors: Sumio Takeuchi, Sakura; Rikichi Murooka, Kamagaya; Jun Sakamoto, Kamakura, all of Japan

[73] Assignee: Sony/Tektronix, Tokyo, Japan

[21] Appl. No.: 223,979

[22] Filed: Jan. 12, 1981

[30] Foreign Application Priority Data

Feb. 18, 1980 [JP] Japan ................................. 55/17805

[51] Int. Cl.³ ............................................ H03K 13/02
[52] U.S. Cl. ...................... 340/347 CC; 340/347 AD; 340/347 SH
[58] Field of Search ................. 340/347 CC, 347 AD, 340/347 R, 347 SH, 347 M; 358/138; 364/571

[56] References Cited

PUBLICATIONS

Kawade, "Electronics and Communications in Japan", vol. 58—A, No. 2, Feb. 1975, pp. 11–20.
Ottesen, "IBM Technical Disclosure Bulletin", vol. 8, No. 7, Dec. 1965, pp. 956–957.

*Primary Examiner*—Charles D. Miller
*Attorney, Agent, or Firm*—George T. Noe

[57] ABSTRACT

A high speed analog-to-digital conversion method and apparatus including a plurality of parallel analog-to-digital converters is disclosed. A clock signal is applied to each of the analog-to-digital converters at different phase relation to increase the equivalent sampling frequency by multiplexing the outputs into a serial form. A reference signal such as a linear ramp or sawtooth signal is used to maintain the correct phase relation, thereby eliminating any errors due to differences in electrical characteristics among the analog-to-digital converters. Such correction may be performed automatically by using a CPU before digitizing an analog input signal or at any desired time.

12 Claims, 6 Drawing Figures

ANALOG-TO-DIGITAL CONVERSION METHOD AND APPARATUS

BACKGROUND OF THE INVENTION

The advantages of digital processing of an analog signal are well known. There arises a need for an analog-to-digital converter (hereinafter referred to as an ADC) responsive to higher sampling frequencies, or high speed ADC's for digitizing analog signals of increasingly higher frequencies. However, development of high speed ADC's satisfying the necessary requirements is attendant with technical difficulties. One conventional technique to alleviate this problem is to use a plurality of ADC's in parallel. A clock signal of different phases is applied to each of the parallel ADC's to digitize the input signal at different times so that the digitized outputs may be arranged sequentially in time to provide a high equivalent sampling frequency. In practice, however, phase shift errors and errors due to differences in propagation delay time have resulted in measurement inaccuracies.

SUMMARY OF THE INVENTION

In accordance with the present invention, a plurality of analog-to-digital converters are arranged in parallel to provide a high-speed analog-to-digital conversion method and apparatus. A clock signal is applied to each of the ADC's at different times in a shifted-phase relationship to increase the equivalent sampling frequency by multiplexing the outputs into a serial form. A reference signal such as a linear ramp or sawtooth signal is used to maintain the correct phase relation, thereby eliminating any errors due to differences in electrical characteristics among the ADC's. Such phase control and correction may be performed automatically by using a central processing unit (CPU) before digitizing the analog input signal, or at any desired time.

It is therefore one object of the present invention to provide a high-speed analog-to-digital conversion method and apparatus in which phase shift errors and errors due to differences in electrical characteristics are corrected.

It is another object of the present invention to provide a high-speed analog-to-digital conversion method and apparatus in which N parallel ADC's are clocked at different clock phases, and in which a processor and phase control means are utilized to provide accurate time relationship of the converted signal.

Other objects and advantages will become apparent to those having ordinary skill in the art upon a reading of the following description when taken in conjunction with the accompanying drawings.

DETAILED DESCRIPTION OF THE INVENTION

Figure 1:
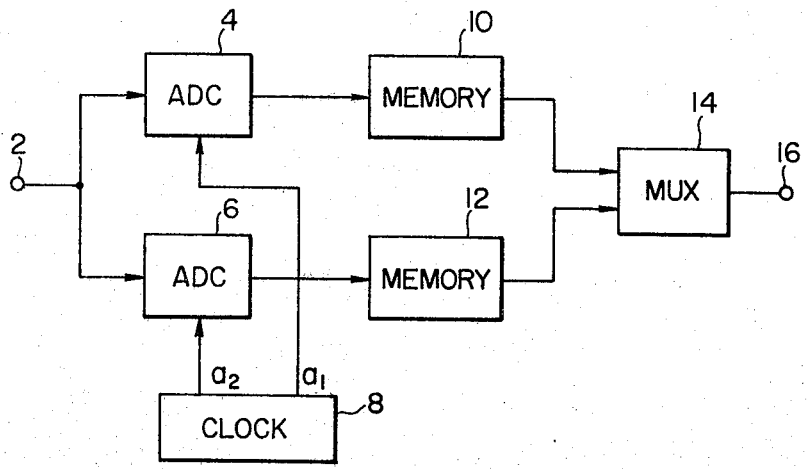
FIG. 1 is a block diagram of a conventional analog-to-digital conversion apparatus.

FIG. 1 shows a block diagram of a conventional analog-to-digital converter. An analog input signal is applied through input terminal 2 to a plurality (two in this particular example) of ADC's 4 and 6 which digitize the analog signal in response to clock signals a1 and a2 applied thereto from clock signal generator 8. The digitized outputs are applied to high speed memories 10 and 12 respectively. The parallel digital outputs read out of memories 10 and 12 are converted into a serial digital signal by multiplexer (MUX) 14 to be applied to a suitable subsequent circuit (not shown) through output terminal 16.

It is understood that the equivalent sampling frequency can be increased by the factor of N by using N (2 or larger integers) number of ADC's. Hence, the resolution is increased by N times compared with a single ADC.

Figure 2:
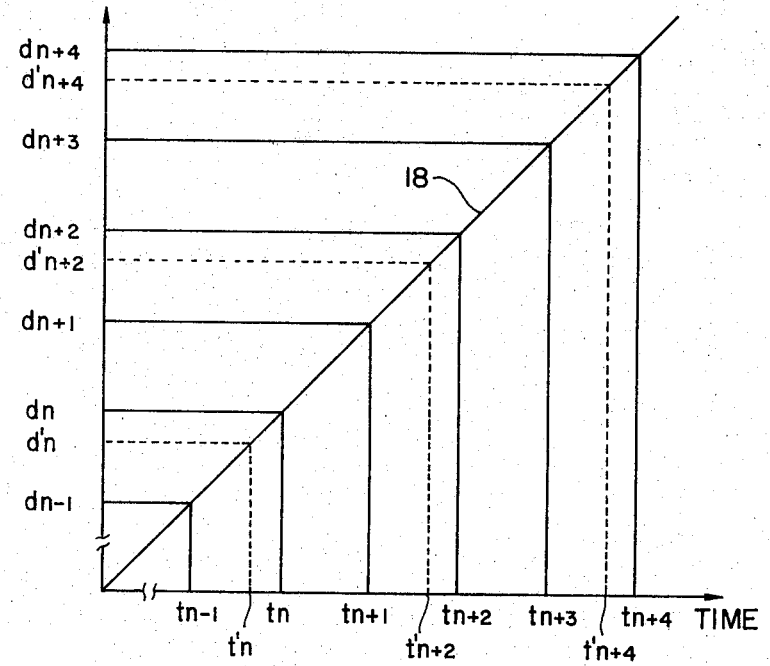
FIG. 2 is a graph for explaining the analog-to-digital conversion.

If the two ADC's shown in FIG. 1 perform sampling of ramp signal 18 at predetermined time points $tn-1$ through $tn+4$ illustrated by solid lines in FIG. 2 (e.g., $a1=tn-1, tn+1, tn+3$, etc.; $a2=tn, tn+2, tn+4$, etc.), correct digital outputs $dn-1, dn, dn+1, dn+2, dn+3, dn+4$, etc., can be obtained. However, in practice, sampling time points $tn, tn+2, tn+4$, etc., may shift respectively to $tn', tn'+2, tn'+4$, etc., because of phase shift error of the clock signals, or differences in characteristics (e.g., propagation delay time among a plurality of ADC's), or a combination of both of these phenomena.

The present invention will be described hereinafter by reference to preferred embodiments shown in the accompanying FIGS. 3 through 6, wherein similar reference numerals are used to represent like elements.

Figure 3:
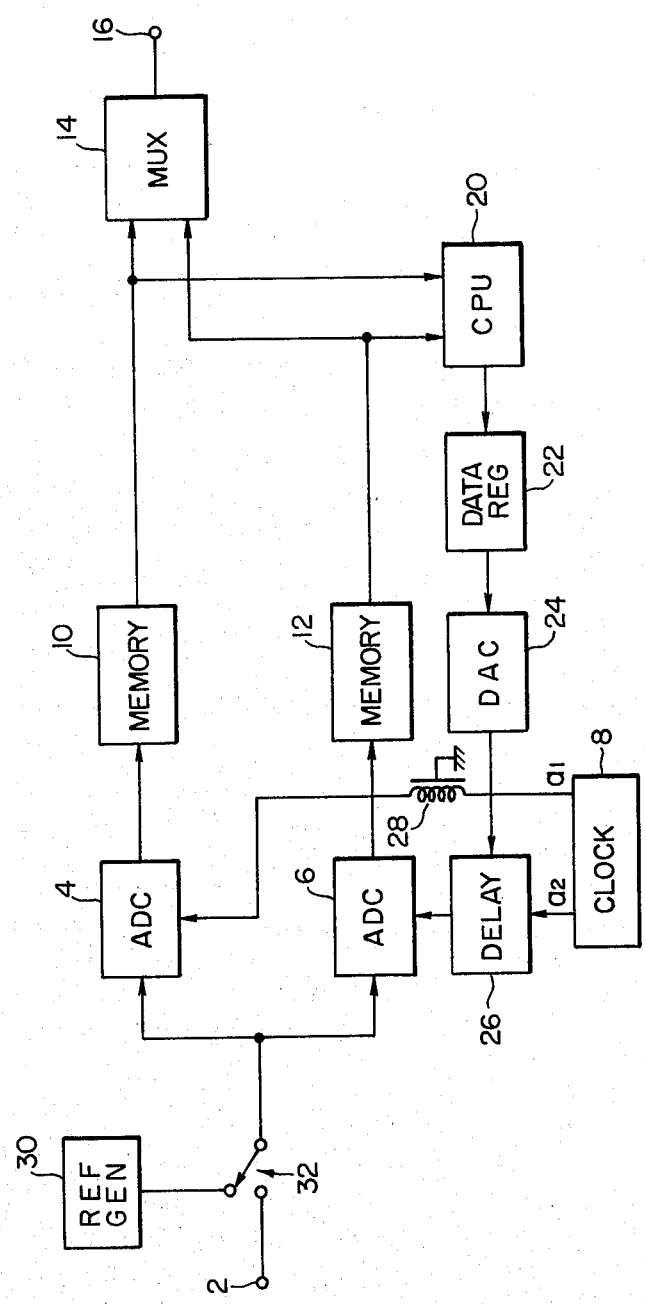
FIG. 3 is a block diagram of one embodiment of an analog-to-digital converter in accordance with the present invention.

FIG. 3 is a block diagram of a first embodiment of this invention. This embodiment differs from FIG. 1 in the addition of processing means comprising central processing unit (CPU) 20 and digital-to-analog converter (DAC) 24, a control loop including variable delay line 26 constituting phase control means, delay line 28, reference signal generator 30, and switch 32.

The operation of the FIG. 3 embodiment is as follows. Initially, switch 32 is switched to reference signal generator 30 to apply, for example, ramp signal 18 as shown in FIG. 2 to both ADC's 4 and 6. If the sampling time positions by clock signals a1 and a2 from clock signal generator means 8 are correct, ADC's 4 and 6 perform sampling at time positions $tn-1$ through $tn+4$ to digitize the signal as is described hereinbefore. The digital outputs will be $dn-1$ through $dn+4$. Now, assume that the sampling time points shifted to $tn', tn'+2, tn'+4$, etc., due to phase error of clock signal a2, digital outputs $dn', dn'+2, dn'+4$, etc., are stored in memory 12 and digital outputs $dn-1, dn+1, dn+3$, etc., in memory 10. The relationship between the phase shift of the clock signal and the error in the digital output is given by the expression $ta=tn-tn'$, where $ta$ represents the phase error. The reference signal 18 may be expressed as $dv/dt=K$. Then, $$ta = 1/2K[(dn+1-dn')-(dn'-dn-1)] \quad (1)$$

CPU 20 calculates the above expression (1) based on the digital data from memories 10 and 12. Now, the voltage versus delay time relationship of variable delay line 26 is M=(delay time)/(voltage) and the digital input versus voltage output relationship of DAC 24 is L=(voltage output)/(digital input). Then, correction data Vc for CPU 20 to correct the control signal of data register 22 may be expressed as:

$$Vc = -1/2KLM[(dn+1-dn')-(dn'-dn-1)] \quad (2)$$

The expression for correction data Vc may be calculated by using three digital outputs. The minus sign is used if the above expression is calculated by using two digital data on clock signal a1 and one digital data on another clock signal a2, but the sign is changed to plus if it is calculated by one digital data on clock signal a1 and two digital data on clock signal a2.

In a case when the correction data cannot be obtained by three digital data, calculations may be performed based on three data at different locations before taking the average of the calculations. For example, if calculations are made for N times, the average value Vc' may be obtained by the following expression:

$$Vc' = \frac{1}{N} \cdot \frac{1}{2KLM} \sum_{n=1}^{N} [(dn+1-dn')-(dn'-dn-1)] \quad (3)$$

The control signal for controlling the variable delay line 26 may be obtained in this manner. If the correction value is null, the phase of the clock signal is accurately corrected and the apparatus is ready to perform analog-to-digital conversion of the analog input signal by manually or automatically switching switch 32 to input terminal 2 under control of CPU 20. If the correction value is other than null, however, the control data (in digital format) stored in data register 22 is applied to variable delay line 26 after being converted to an analog signal by DAC 24. The new correction value Vc or Vc' is obtained again based on the corrected digital data in the same manner as described hereinbefore. This operation is repeated until the null corrected value is reached. Then, CPU 20 controls switch 32 to input terminal 2 to digitize the input analog signal. Delay line 28 in the signal path for clock signal a1 is not always necessary but is used to allow clock signal a2 to lead in phase with respect to clock signal a1, thereby making phase correction operation easy. In addition, phase correction of the clock signal will be easier if the delay time of delay line 28 can be varied manually.

Figure 4:
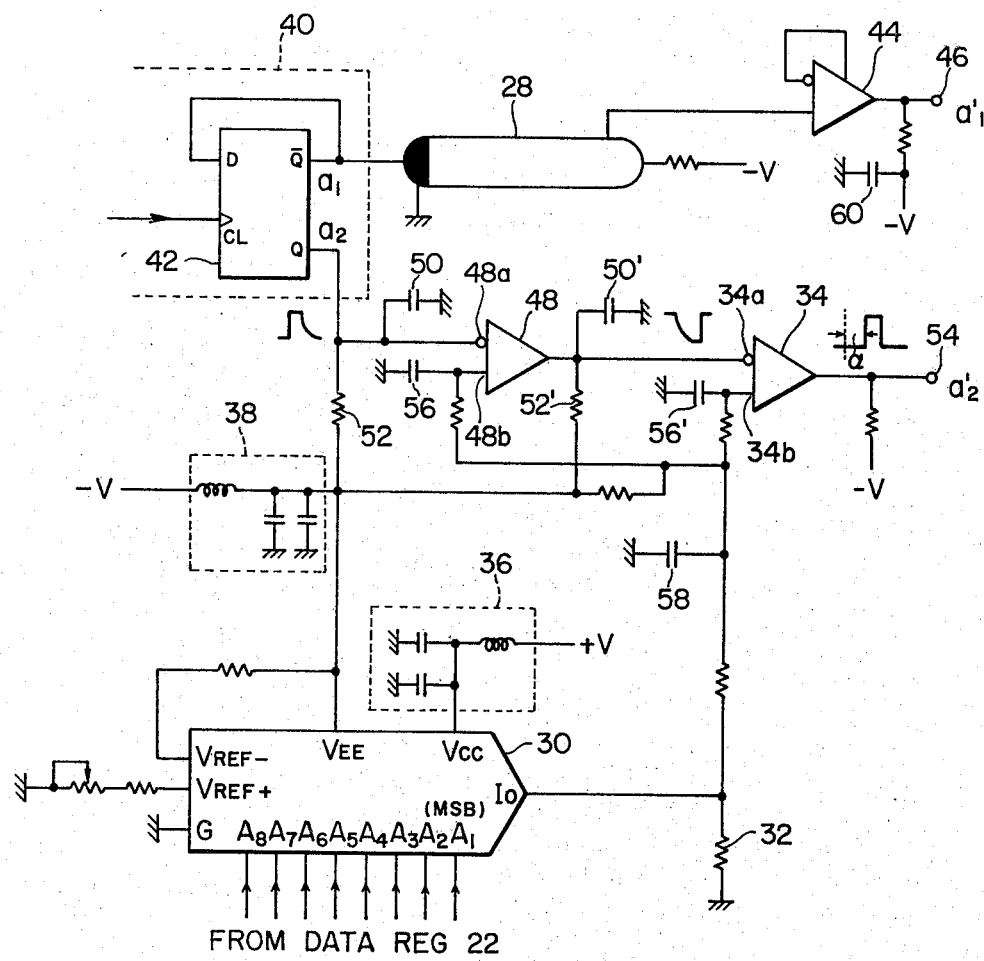
FIG. 4 is a detailed schematic of the phase control portion of the block diagram of FIG. 3.

FIG. 4 shows a detailed circuit schematic of important blocks in FIG. 3. Applied to input terminals A1 through A8 of DAC 30 corresponding to DAC 24 in FIG. 3 is the digital control value from data register 22 corrected by calculating the aforementioned expression (2) or (3). The control signal current from output terminal Io of DAC 30 flows into ground through resistor 32 after conversion into an analog signal. The voltage drop across resistor 32 due to the control signal current determines the threshold level of comparator 34 applied to reference terminal 34b. Circuit networks 36 and 38 include inductors and capacitors to provide decoupling for voltage sources +V and −V. Circuit 40 represents one part of clock signal generator means 8 in FIG. 3. D-type flip-flop 42 generates clock signals a1 and a2 180 degrees out of phase with each other. That is, flip-flop 42 generates clock signals a1 and a2 respectively on the output terminals Q and Q̄ in response to the clock signal applied to clock terminal CL. Clock signal a1 is applied to ADC 4 in FIG. 3 through delay line 28 to compensate for the delay time equal to one half of the entire delay time range of the variable delay circuit, open emitter buffer amplifier 44 and terminal 46. On the other hand, clock signal a2 is applied to inverting input terminal 48a of comparator 48. Capacitor 50 and resistor 52 change the falling edge of clock signal a2 into a logarithmic waveform with time constant $\tau$. The inverted output from comparator 48 is then applied to inverting input terminal 34a of comparator 34 with logarithmic waveform in the rising edge by capacitor 50' and resistor 52'. As mentioned above, applied to the other input terminals 48b and 34b of comparator 48 and 34 is the threshold level which is a function of the output from DAC 30. Therefore, delay is caused by comparator 48 at the falling edge of clock signal a2, while by comparator 34 at the rising edge of clock signal a2. As a result, derived from the output terminal of comparator 34 is clock signal a2' having the same pulse width as clock signal a2 but delayed by the time $\alpha$ which is determined by the threshold level. Clock signal a2' is then applied to ADC 6 in FIG. 3 through terminal 54. Capacitors 56, 56' and 58 are used for DC stabilization and capacitor 60 for decoupling.

Figure 5:
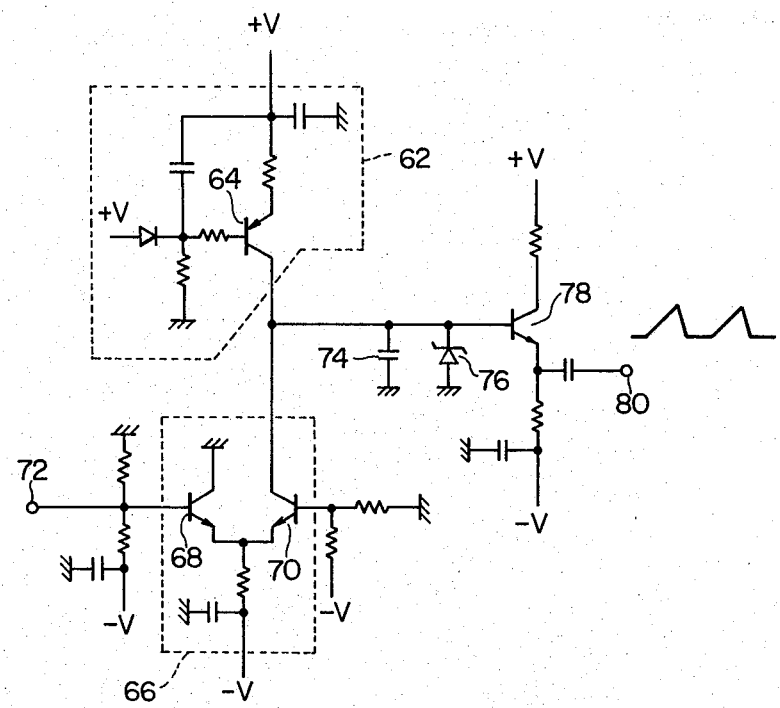
FIG. 5 is a detailed schematic of the reference signal generator portion of the block diagram of FIG. 3.

FIG. 5 shows an exemplary circuit schematic of reference signal generator 30 in FIG. 3. Transistor 64 and the associated circuit components constitute constant current source 62. Transistors 68 and 70 and the associate circuit components constitute known current switch 66 for alternately turning on and off in response to the clock signal applied to terminal 72. In a case when transistor 70 is off, charge is stored in capacitor 74 by constant current source 62. When the voltage across capacitor 74 reaches a predetermined level, Schottky diode 76 turns on, thereby generating a sawtooth reference signal on output terminal 80 through buffer amplifier 78 as shown in the drawing. Terminal 80 is connected to switch 32 in FIG. 3.

Figure 6:
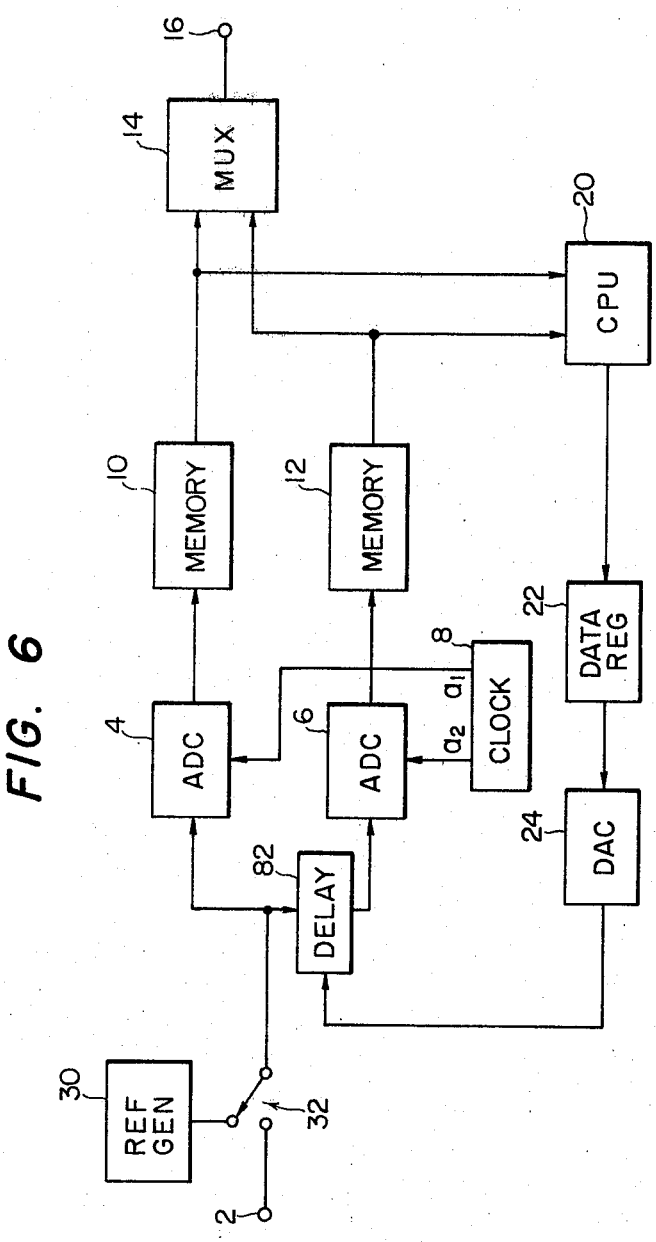
FIG. 6 is a block diagram of an alternative embodiment of the present invention.

FIG. 6 is a block diagram illustrating a second embodiment according to this invention. The second embodiment differs from the first embodiment in FIG. 3 in that the phase of the clock signal to be applied to the ADC is corrected in the first embodiment, but the phase of the analog signal to be applied to the ADC is corrected in the second embodiment. Variable delay means 82 for delaying the analog quantity is connected at the input side of ADC 6. Also, a delay circuit may be connected to the clock signal a2 or the input side of ADC 4. The second embodiment operates basically in the same manner as the first embodiment, therefore the detailed description will be omitted.

It is, of course, possible to correct the clock and analog input signals simultaneously by combining the phase correction techniques in the first and second embodiments. Any technique can be used to correct the phase difference between the clock and analog input signals.

In FIGS. 3 and 6, more accurate analog-to-digital conversion may be achieved by performing the aforementioned phase correction process of the digital outputs from ADC's 4 and 6 periodically even after null correction has been reached (or correction is completed) to flip over switch 32 to input terminal 2. Switch 32 may be operated automatically.

For averaging different data to improve the correction accuracy, the reference signal waveform may be any form other than the aforementioned sawtooth signal as long as N data are symmetrical with respect to the center data at the (N+1)/2th time point.

The variable delay means may be one using a variable capacitance diode, or the operation output of CPU may directly be stored in an analog memory device after digital-to-analog conversion.

The embodiments described use only two ADC's. However, it is obvious that this invention is applicable to more than two ADC's.

In addition, reference signal generator 30 may be eliminated if a reference signal is included in the analog input signal.

As is described hereinbefore, any phase difference between the clock and analog input signals can be corrected automatically according to this invention. This indicates that any variation in propagation delay time due to deviation in the clock signal or temperature and long term drift of circuit components used in the ADC's can be corrected properly, thereby performing an excellent and high precision analog-to-digital conversion at high frequencies over a long period of time.

What we claim as being novel is:

1. An analog-to-digital conversion apparatus, comprising:
    a plurality of analog-to-digital converters arranged in parallel for converting an analog input signal into a digital signal;
    clock signal generation means for driving said analog-to-digital converters at different phases to each other;
    a reference signal generator for generating a reference signal to be digitized by said analog-to-digital converters; and
    control means for controlling the phase relation of the clock signals from said clock signal generation means to be applied to each of said analog-to-digital converters in response to the outputs thereof when the reference signal is digitized.

2. An analog-to-digital conversion apparatus in accordance with claim 1, wherein said reference signal generator is a ramp signal generator.

3. An analog-to-digital conversion apparatus in accordance with claim 2, wherein said control means includes arithmetic operation means for comparing the differences of digital outputs digitized by said analog-to-digital converters at sequential time points.

4. An analog-to-digital conversion apparatus in accordance with claim 3, wherein said arithmetic operation means takes the average of digital outputs digitized at different portions of the reference signal.

5. An analog-to-digital conversion apparatus in accordance with claim 1 further including multiplexing means for converting the parallel digital outputs from said plurality of analog-to-digital converters into a serial output.

6. An analog-to-digital conversion apparatus, comprising:
    a first analog-to-digital converter and a second analog-to-digital converter arranged in parallel;
    a clock generator for applying a clock signal of different phase to said first and second analog-to-digital converters;
    a reference signal generator for generating a reference signal;
    means for applying either an analog input signal or the reference signal to said first and second analog-to-digital converters; and
    phase control means for controlling the relative digitizing time of said first and second analog-to-digital converters in response to digitized data of the reference signal.

7. An analog-to-digital conversion apparatus in accordance with claim 6 further including a multiplexer for converting the digital outputs from said first and second analog-to-digital converters into a serial digital data.

8. An analog-to-digital conversion apparatus in accordance with claim 6 or 7, wherein said clock generator includes a flip-flop to provide a complementary square wave operably coupled to said first and second analog-to-digital converters.

9. An analog-to-digital conversion apparatus in accordance with claim 8 wherein the complementary square wave is applied to said first analog-to-digital converter through a fixed delay line and to said second analog-to-digital converter through a variable delay circuit under control of said phase control means.

10. An analog-to-digital conversion apparatus in accordance with claim 8 wherein said phase control means controls the phase of the analog input signal to be applied to one of said analog-to-digital converters.

11. An analog-to-digital conversion method including first and second analog-to-digital converters, comprising the steps of:
    applying a reference signal to both of said first and second analog-to-digital converters;
    digitizing the reference signal at sequentially different time points by applying a clock signal of different phase to each other to said first and second analog-to-digital converters;
    performing arithmetic operation of sequential data digitized by said first and second analog-to-digital converters;
    controlling the phase of said clock signal for said second analog-to-digital converter to digitize exactly the center time point of two succeeding digitize times of said first analog-to-digital converter; and
    then applying an analog input signal to said first and second analog-to-digital converters.

12. An analog-to-digital conversion method in accordance with claim 11 further including the step of multiplexing the digital outputs from said first and analog-to-digital converters to provide a serial digital output.

* * * * *